United States Patent
Richter et al.

(10) Patent No.: US 7,195,961 B2
(45) Date of Patent: Mar. 27, 2007

(54) SOI STRUCTURE COMPRISING SUBSTRATE CONTACTS ON BOTH SIDES OF THE BOX, AND METHOD FOR THE PRODUCTION OF SUCH A STRUCTURE

(75) Inventors: Steffen Richter, Apfelstaedt (DE); Dirk Nuernbergk, Erfurt (DE); Wolfgang Goettlich, Erfurt (DE)

(73) Assignee: X-Fab Semiconductor Foundries, AG, Erfurt (DE)

( * ) Notice: Subject to any disclaimer, the term of this patent is extended or adjusted under 35 U.S.C. 154(b) by 0 days.

(21) Appl. No.: 10/543,923

(22) PCT Filed: Jan. 30, 2004

(86) PCT No.: PCT/DE2004/000147

§ 371 (c)(1),
(2), (4) Date: Aug. 1, 2005

(87) PCT Pub. No.: WO2004/068579

PCT Pub. Date: Aug. 12, 2004

(65) Prior Publication Data

US 2006/0154430 A1    Jul. 13, 2006

(30) Foreign Application Priority Data

Jan. 30, 2003    (DE)    ............... 103 03 642

(51) Int. Cl.
*H01L 21/00* (2006.01)

(52) U.S. Cl. ............... 438/151; 257/E21.193
(58) Field of Classification Search ............... 438/149, 438/151

See application file for complete search history.

(56) References Cited

U.S. PATENT DOCUMENTS

| | | | |
|---|---|---|---|
| 5,654,573 A * | 8/1997 | Oashi et al. | 257/349 |
| 5,725,729 A * | 3/1998 | Greiff | 438/50 |
| 5,805,497 A | 9/1998 | Uchida | |
| 6,121,659 A * | 9/2000 | Christensen et al. | 257/347 |
| 6,919,236 B2 * | 7/2005 | Wei et al. | 438/149 |
| 2001/0033001 A1* | 10/2001 | Kato | 257/347 |
| 2002/0063285 A1 | 5/2002 | Wu et al. | |
| 2002/0076880 A1* | 6/2002 | Yamada et al. | 438/243 |
| 2003/0001658 A1 | 1/2003 | Matsumoto | |

FOREIGN PATENT DOCUMENTS

| | | |
|---|---|---|
| DE | 44 41 724 A1 | 5/1996 |
| EP | 0 948 054 A2 | 10/1999 |
| WO | WO 99/33115 | 7/1999 |

OTHER PUBLICATIONS

Qin Lu, et al., "High Voltage Silicon-on-insulator (SOI) MOSFETs", Power Semiconductor Devices and ICs, 1991. ISPSD '91., Proceedings of the 3rd International Symposium on Baltimore, MD, USA Apr. 22-24, 1991, New York, NY, USA, IEEE, Us, Apr. 22, 1991, pp. 36-39.

* cited by examiner

*Primary Examiner*—W. David Coleman
(74) *Attorney, Agent, or Firm*—Hunton & Williams, LLP (57) ABSTRACT

Disclosed are an arrangement and a production method for electrically connecting (20) active semiconductor structures (40) in the monocrystalline silicon layer (12) located on the front face of silicon-on-insulator semiconductor wafers (SOI; 10) to the substrate (13) located on the rear side and additional structures (13*a*) that are disposed therein. The electric connection is made through the insulator layer (11).

25 Claims, 6 Drawing Sheets

SOI STRUCTURE COMPRISING SUBSTRATE CONTACTS ON BOTH SIDES OF THE BOX, AND METHOD FOR THE PRODUCTION OF SUCH A STRUCTURE

FIELD OF THE INVENTION

The invention relates to SOI structures (silicon on insulator), in which device structures are located in an upper semiconductor layer and within the semiconductor substrate, which are contacted with electric interconnections that are formed through an insulating layer.

BACKGROUND ART KNOWLEDGE

An SOI structure is composed of a thin semiconductor layer, which is located on a thin oxide layer. The oxide layer is typically formed as a buried oxide (BOX) and is, in turn, formed on a semiconductor layer, typically a silicon layer, that is, the silicon substrate, which usually has a thickness of 300 μm to 800 μm. The substrate only serves the purpose of handling the structure. The actual devices and device functions are realized in the semiconductor layer in the vicinity of the surface, similar to usual CMOS processes on homogenous silicon wafers.

A substantial difference in SOI technologies with respect to standard CMOS processes resides in the fact that devices are dielectrically isolated from each other by trenches which extend down to the insulation layer. Accordingly, a mutual electrical influence of the devices is significantly reduced. This dielectric isolation renders the SOI technology also suitable for high voltage applications.

It is advantageous when the devices are not coupled to each other via the substrate. Thus, certain non-desired substrate effects may be avoided, such as latch-up, significant reverse currents at elevated temperatures, increased parasitic capacitances at the source/bulk or drain/bulk-pn junctions.

U.S. Pat. No. 6,188,122 (Davari, IBM) discloses an SOI structure having a "capacitor" within the substrate and an FET (active device) in the upper silicon layer, column 4, line 40 onward. Conductive vias extend through the oxide layer (cf. 30), column 5, line 11 onward.

SUMMARY OF THE INVENTION

It is an object of the invention to provide a method that allows an improved substrate utilization for increasing the package density. Qualitative improvements of the semiconductor circuitry are to be achieved. The invention may also extend integration capabilities of circuit arrangements of SOI semiconductor wafers to allow the integration of devices of other technologies, such as bipolar devices.

An embodiment of the present invention is directed to a method for manufacturing an integrated circuit on and in an SOI semiconductor wafer having a front and a back, wherein first structures having active devices in an upper semiconductor layer (12) and second structures (13a, 13a', 13c) of devices within the substrate (13) are connected by electric connection (20, 22) formed through an insulating layer (11), the method comprising the following steps: performing an ion implantation (30, 31) with highly energetic ions in certain areas (13', 13") from the front through the upper semiconductor layer (12). through the insulating layer (11) and into the substrate (13); performing a temperature treatment for activating the ions implanted into the substrate (13) in accordance with an implanted ion species, wherein the implanted ions are activated in a plurality of steps with different temperatures: forming the first structures (30, 40, 50, 60) at least partially in the upper semiconductor layer as a single crystalline layer (12); forming at least one of a plurality of vias in the insulating layer (11); filling (20, 22) the at least one via (19, 21) in the insulating layer with a metallic material to provide a metallic filling; forming-in the area of the first structures (40, 50, 60) insulated with respect to each other-metal conductors to electrically connect the first structures of the front with the second structure within the substrate (13) via the at least on metal filling in the at least one via.

Another embodiment of the present invention is directed to a method for forming an integrated circuit with a SOI semiconductor wafer, active device structures in a thin upper crystalline semiconductor layer being connected with device structures within substrate by means of electrical connections formed through the insulating layer, wherein a seguence of main method steps is performed: in specified areas, performing an ion implantation with highly energetic ions from the front through the single crystalline semiconductor layer and the insulating layer into the substrate; performing a temperature treatment for activating the implanted ions in several steps of different temperatures, adapted to the ion species implanted; forming upper device structures in the single crystalline layer; forming vias in the insulating layer at locations where no active thin single crystalline silicon layer is present; filling the vias in the insulating layer with a metallic material; forming metallization layers, insulated from each other, within the area of the active device structures and electrically connecting the upper structures with those device structures within the substrate by means of the metal filling in said vias in the insulating layer.

An embodiment of the present invention is directed to a method for forming an integrated circuit with a SOI semiconductor wafer, active device structures in a thin upper crystalline semiconductor layer being connected with device structures within substrate by means of electrical connections formed through the insulating layer, wherein a sequence of main method steps is performed: in specified areas, performing an ion implantation with highly energetic ions from the front through the single crystalline semiconductor layer and the insulating layer into the substrate; performing a temperature treatment for activating the implanted ions in several steps of different temperatures, adapted to the ion species implanted; forming upper device structures in the single crystalline layer; forming vias in the insulating layer at locations where no active thin single crystalline silicon layer is present; filling the vias in the insulating layer with a metallic material; forming metallization layers, insulated from each other, within the area of the active device structures and electrically connecting the upper structures with those device structures within the substrate by means of the metal filling in said vias in the insulating layer; and the metallization layers having metal conductors (15, 15'), the metal conductors being provided in the form of metal bridges on at least two non-identical levels above the insulating layer.

The present invention is based on the concept that the substrate may be used for extending the circuitry, that is, to create doped regions in the substrate so as to allow the integration of additional devices and devices of different type in SOI circuits. At the same time, by means of the electric connections to the substrate, any reactions on the circuit structures in the thin upper silicon layer may be suppressed. In order to incorporate the substrate, a back side metallization of the substrate may be used. On the other hand, the active devices realized in the upper silicon layer are sensitive with respect to a potential applied to the back side. It is a disadvantage that, for instance, MOSFETs may be driven into the on state from the back side at the presence of a high back side voltage, or that an on-resistance of high voltage transistors may depend on the backside voltage. Even simple diodes exhibit a dependence of their breakthrough voltage with respect to the applied substrate potential. These effects are to be taken into consideration during the incorporation of the substrate, that is, fabrication of electric connections to the substrate. Substrate contacts (back side metallization) are, however, initially not a part of the SQl technology. Corresponding packages do not provide a backside contact and frequently the number of pins in circuits is not sufficient to allow contact to the back side.

BRIEF INTRODUCTION TO THE DRAWINGS

This electric connection allows, in principle, that the substrate be utilized in the sense of a qualitative extension. The following examples are provided for a more detailed explanation of the invention, wherein the examples are substantially self-explanatory to the skilled person on the basis of the reference signs provided.

DETAILED DESCRIPTION OF THE EMBODIMENTS

By means of layers formed in the substrate 13 and having a certain doping, and by means of the electric connections 20 connecting to the device structures on the top side or the front layer 12 of the SOI wafers 10, various active and passive structures may be realized by desired or appropriate combination.

Via the metal bridge 20 connecting to the substrate 13, conducting (ohmic) contacts and Schottky contacts may be formed. Diodes, MOSFETs, bipolar transistors, thyristors, and IGBTs may be realized as active structures.

Capacitors, resistors and shielding layers may be realized as passive structures.

While capacitors and resistors use contacts, contacting of shielding layers is not always necessary. Such regions are then floating with respect to any electric potential (n.c.). By shielding via a substrate implantation, a desired reduction of the adverse substrate influence (substrate bias) on structures in the upper active semiconductor layer 12 is accomplished. The shielding, which is not particularly illustrated, provides a decoupling of these active structures, for instance, 40 or 50, with respect to effects that may occur at the back side R of the SOI wafer 10.

A plurality of active and passive structures having enhanced properties may be realized.

Figure 1:
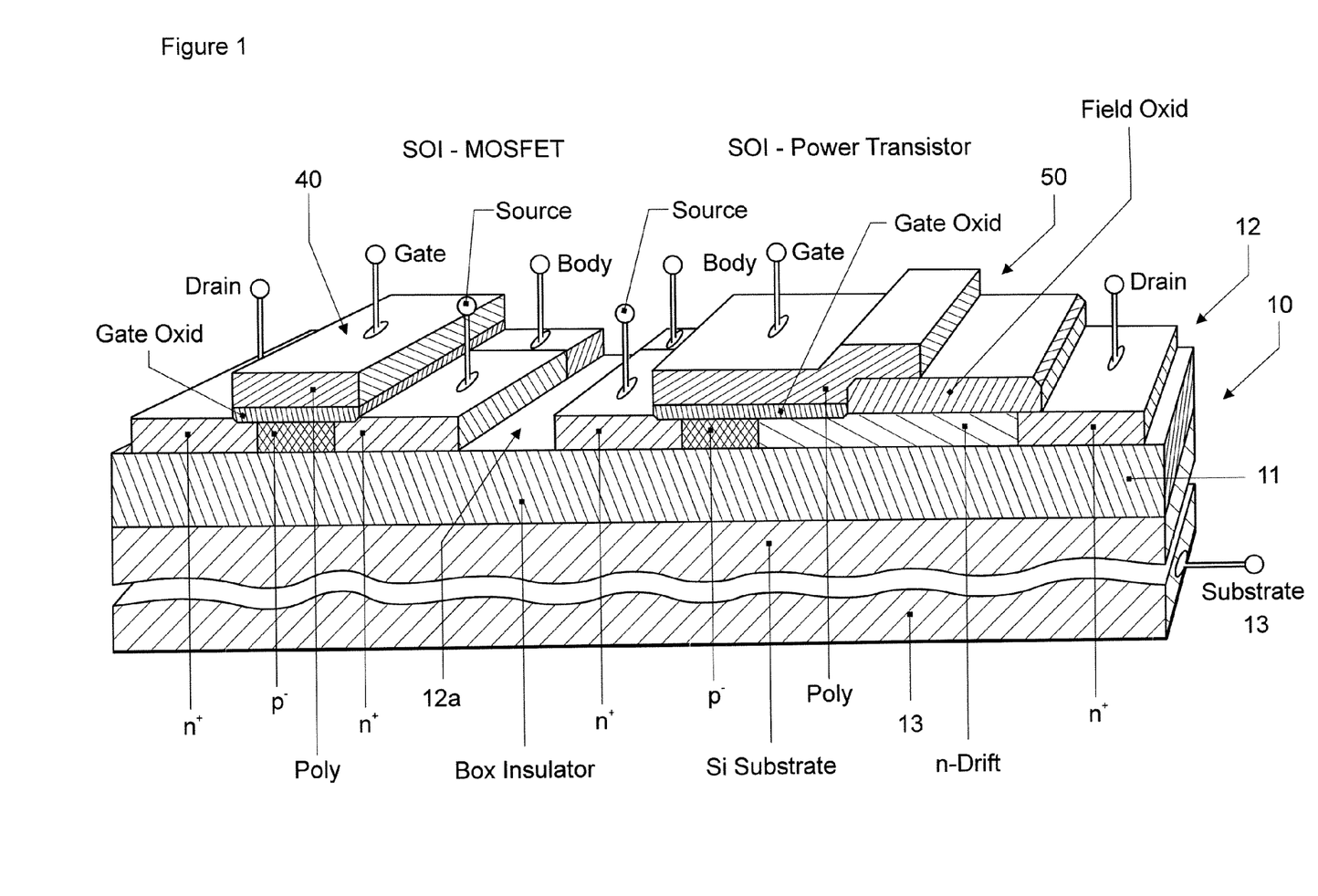
FIG. 1 schematically shows two different types of transistors 40, 50, which are formed on an SOI wafer 10 by means of SOI technology.

The SOI wafer structure shown in FIG. 1, having an insulating layer 11, a thicker substrate 13, and an active thinner layer 12 above the insulator 11, exhibits two different types of transistors 40, 50, that is, an SOI MOSFET and an SOI power transistor. These devices are already at least partially integrated into the active silicon layer 12, and between the transistors 40, 50, a trench 12A is provided that intercepts or separates the active silicon layer 12. Further separations are provided at the left side and the right side of the two exemplary transistor types illustrated, and these separations will hereinafter be referred to as 12a, 12b, while the residual portions of the active layer 12 with its corresponding structure will be referred to as 12', 12" and 12'''.

The structure of the transistors will not be described in detail and is of standard configuration, having a gate, a drain and a source, as well as a bulk contact, which is here referred to as body, since it does not extend to the substrate, but instead is provided above the insulating layer 11.

In FIG. 1, no vias are shown which extend through the insulating layer and down to the substrate 13. These vias are shown in more detail in the following sections, in which structures of devices within the substrate 13 are also illustrated, which, in FIG. 1, are omitted for the sake of simplicity so as to illustrate the configuration of transistors formed on an SOI wafer.

The reference numerals are used identically for all of the embodiments so that they may, without any specific reference, be considered as referring to identical components.

Figure 2:
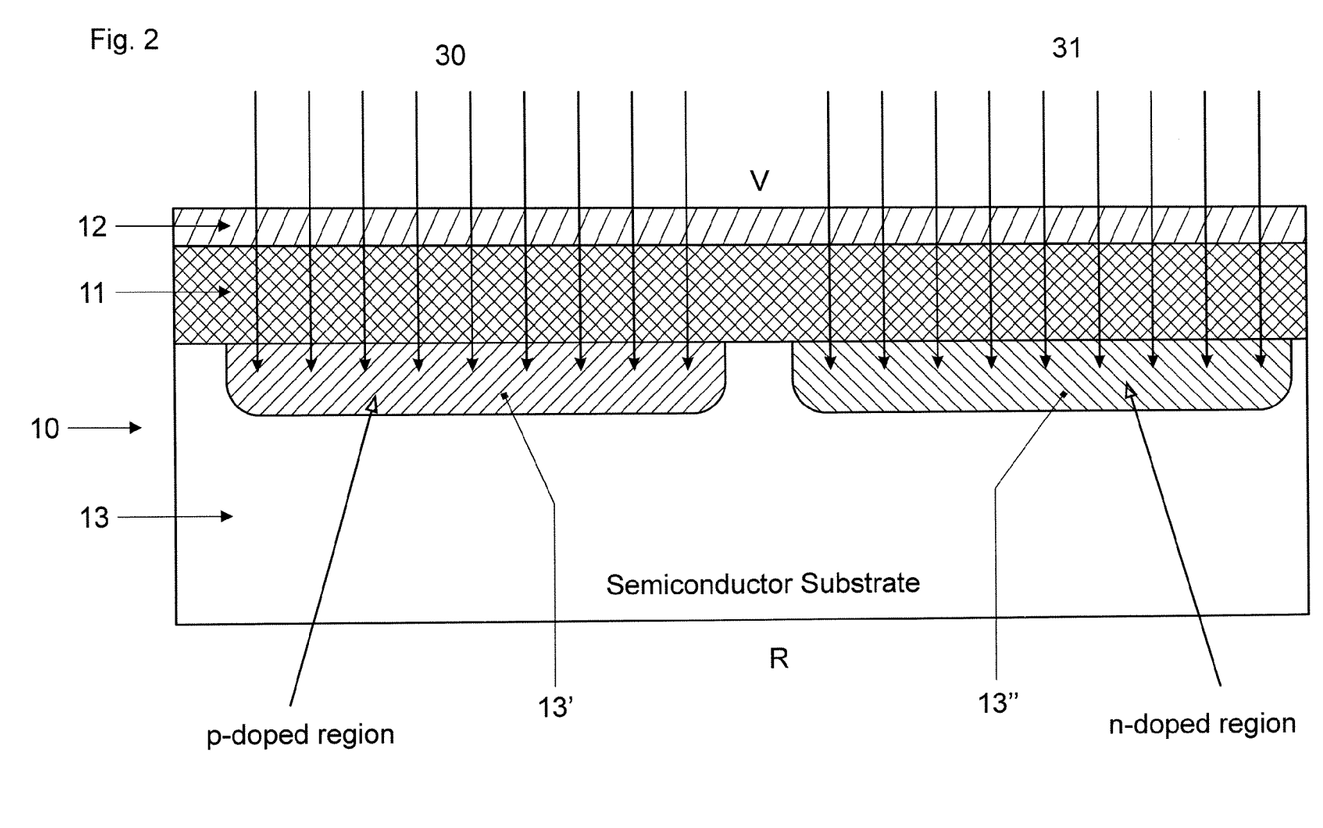
FIG. 2 schematically illustrates the way how p- and n-doped regions may be created closely below the interface between the isolation oxide 11 and the substrate 13 within the substrate 13 by means of a few process steps including p- and n-ion implantations followed by a thermal treatment (the latter one is not illustrated).

FIG. 2 illustrates the first method steps, here the irradiation of ions by means of a p-ion implantation and an n-ion implantation. The p-implantation 30 and the n-implantation 31 are illustrated by vertical arrows. They extend through the active silicon, provided as layer 12, from the front side V, through the buried oxide insulator 11, which represents the insulating layer of the SOI wafer, and into the substrate 13, so as to form doped regions 13', 13" that are symbolically illustrated as p-region (p-doped region) and n-region 13" (n-doped region), respectively. These regions form device structures in the following examples below the insulating layer 11 within the substrate.

A thermal treatment, which is not specifically illustrated, activates the aforementioned regions 13', 13" closely below the interface between the insulating layer (the BOX) and the remaining substrate 13. The active structures, which are symbolically illustrated by means of FIG. 1 and FIG. 2, are those first active structures for devices 40, 50 above the insulator 11 and active structures 13', 13" below this insulator, which are located within the substrate as second structures for other devices. Electrical connections, which are explained in more detail in the following examples, are formed through the insulating layer.

Figure 3:
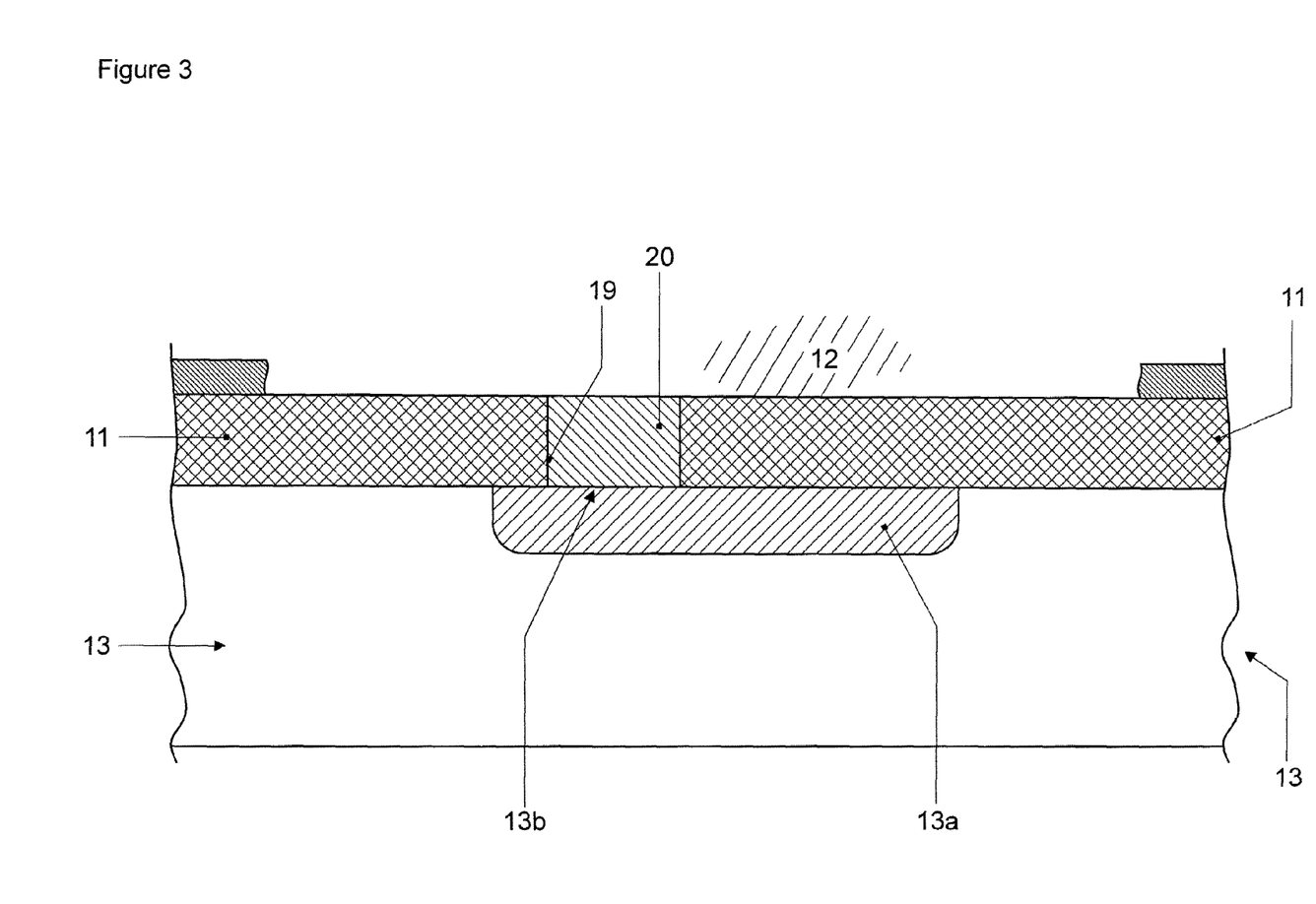
FIG. 3 schematically illustrates in the simplest case the passing through of a contact (as conductor) from a doped zone 13A within the substrate through the isolation oxide 11 to the upper silicon layer 12 (the later is not shown), of however FIG. 2.

In the simplest case, the embodiment according to FIG. 3 schematically illustrates a via 19, formed by the filling 20 within the insulating layer 11. The via of the contact of a doped zone 13a, which is formed according to FIG. 2, and which is located within the substrate 13 and extends through the insulating layer 11 representing the BOX to the upper silicon layer 12, which is merely schematically illustrated, is metallic or electrically conductive (ohmic contact).

The first structures above the insulating layer 11, which are arranged in a thin layer 12 and since this layer is thinner than the remaining layers 11, 13 used, are formed, for example, according to FIG. 1 along with the components illustrated therein, or along with other suitable components, depending on the application, bipolar transistors, thyristors. IGBTs or diodes. The vias are formed at locations at which the active silicon layer 12 is no longer present. At locations at which no active single crystalline layer 12 is present, the fillings 20 of the vias 19 of the insulating layer 11 may be formed with a metal. These areas are considered as lateral insulation areas, which are located between two active residual layers of the active silicon layer 12, that is, for instance, the lateral insulation area 12a of FIG. 3b located between the residual layers 12" 12"', or the lateral insulation area 12c located between the two residual layers 12" and 12' of FIG. 3a, or the lateral insulation area 12b between the residual layers 12' and 12"' in the same figure.

The specified areas including an ion implantation are indicated in FIG. 2 as 13' and 13" and are correspondingly indicated in the remaining figures, such as the layers 13a, 13a' and 13a".

The ion implantation 30, 31 using highly energetic ions is performed from the front side with respect to the specified areas, which are provided due to the topology to be achieved. The ion implantation is performed through the semiconductor layer 12 and the insulating layer 12 and into the substrate 13, thereby using templates and different types of ions 30 or 31, depending on the device to be formed. The activation by temperature may be performed in several steps and using different temperatures, adapted to a respective selected ion species implanted according to the aforementioned different ion implantations.

Figure 3A:
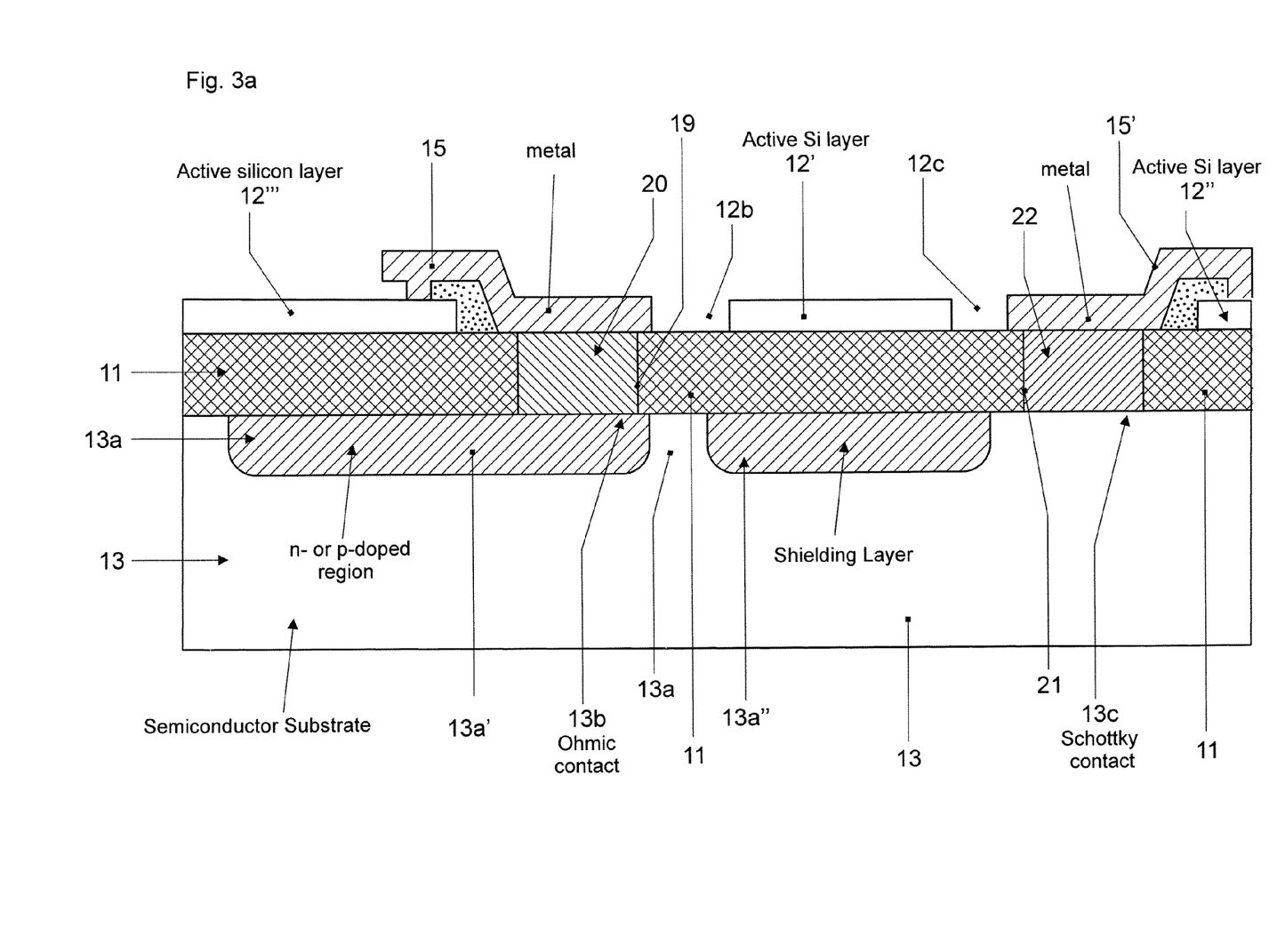
FIGS. 3a to 3c illustrate embodiments of the above-mentioned examples, including the SOI wafer 10.
Figure 3B:
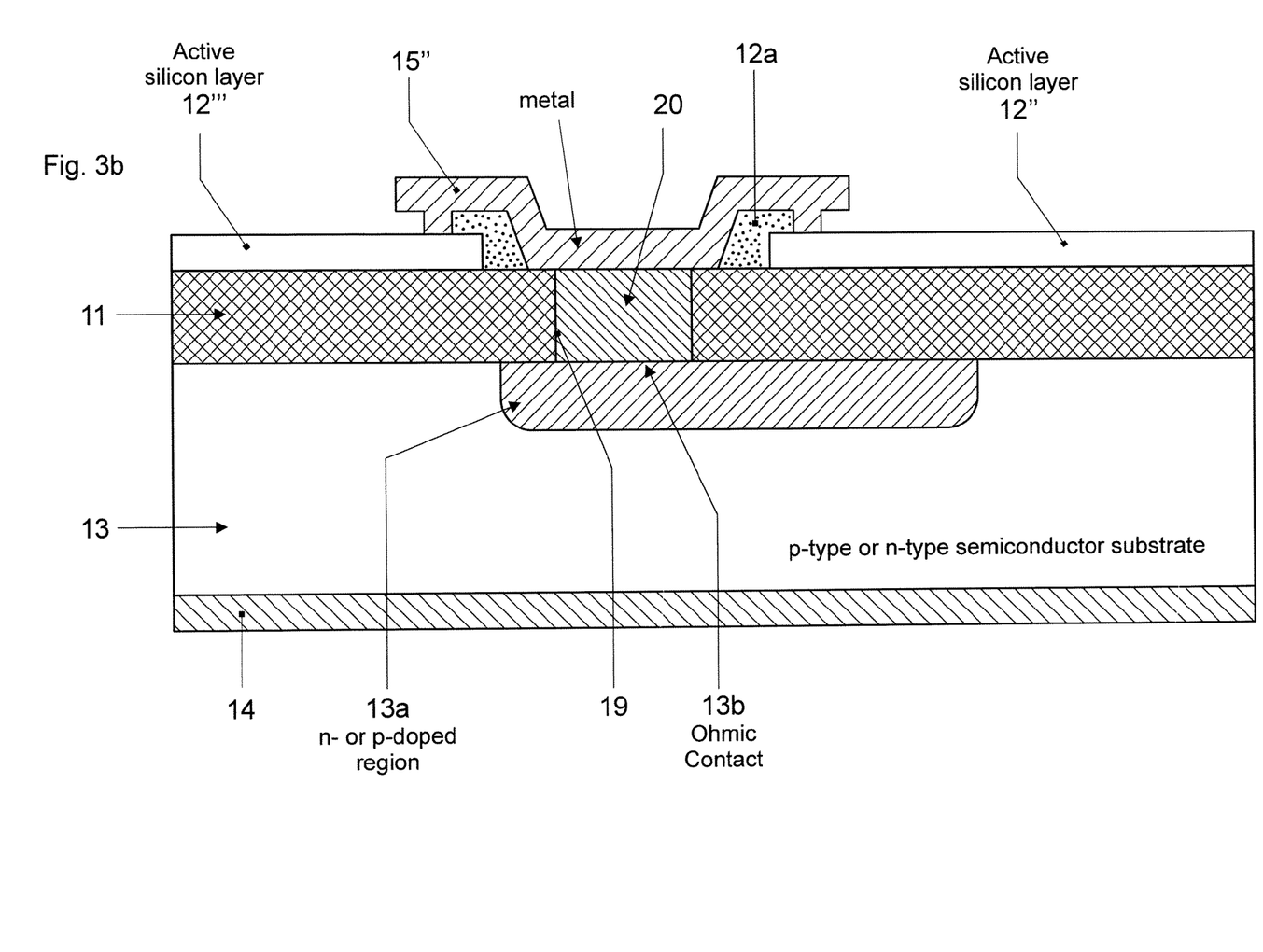
Figure 3C:
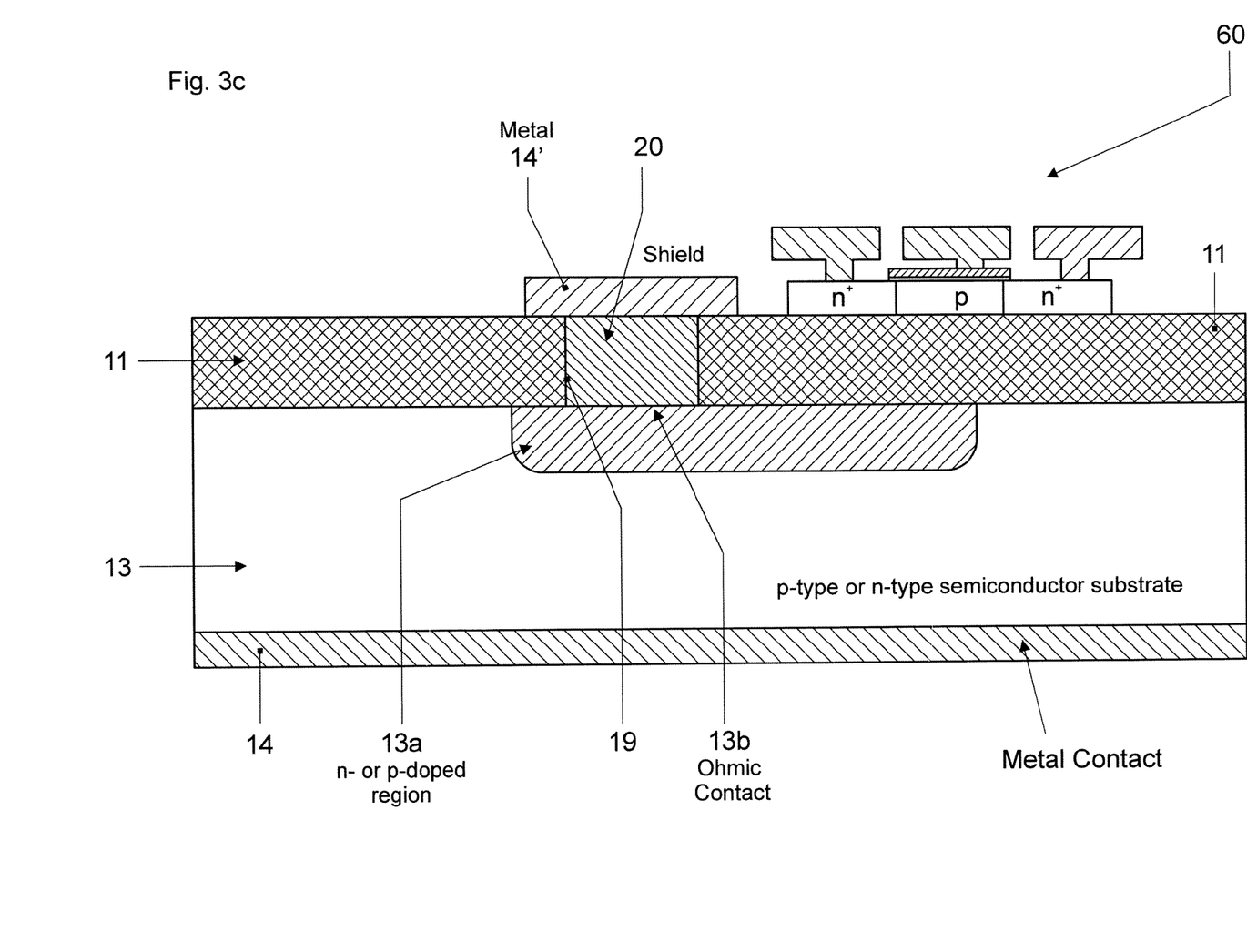

Within the active structures, metallization layers may be provided, which are shown in FIGS. 3a to 3c in various embodiments and applied to the previously described SOI wafer structure. The metallization layers may, for instance, be located on the back side R, as is shown as layer 14 in FIGS. 3b and 3c. The metallization layers may be insulated from each other. Also, a filling is considered as a metallization, which electrically connects first structures on the upper side of the insulating layer with second structures below the insulating layer within the substrate 13. The metal filling 20 connects in FIG. 3, according to the illustration of FIG. 3, a doped region 13a' (in FIG. 3, 13a) with a metallization layer 15 located above the insulator. This metallization layer is formed as a bridge such that it connects the electrically conductive filling 20 with a device on the front side, which is located within the residual silicon layer 12"', as may be seen, for instance, in FIG. 1.

The insulating layer 11 may be provided in the form of a silicon dioxide layer, which is typically used in the vast majority of the SOI wafers. The substrate 13 may be comprised of a single crystalline silicon.

The various types of contacts which result from the metal bridge (the filling 20), are illustrated in FIG. 3a side by side. Schottky contacts are obtained with a metal filling 22 in a via 21, when the upper portion of the substrate does not have a doped region. Within the region of the via, a Schottky contact is formed together with the substrate 13. This Schottky contact 13c is illustrated in FIG. 3a on the right hand side. Above the filling 22 within the via 21 there is also shown a metal bridge which is mirror-reflected with respect to the metal bridge 15, here indicated as bridge 15', used for the electrically conductive connection with the active residual layer 12" located on the right hand side of the lateral insulation area 12c.

A shielding layer 13a" is illustrated below the residual layer 12' between the lateral insulation areas 12b, 12c. This shielding layer is located immediately below the insulating layer 11 and is not contacted in an electrically conductive manner.

At the left side thereof is located the previously described ohmic contact 13b between the metal filling 20 and the n- or p-doped region 13a'. Here, a diode structure is formed between the doped region and the substrate 13, other than in an ohmic contact (without directional dependence with respect to the conductivity in the contact plane at the lower side of the insulating layer BOX, indicated as 11).

The device formed according to the described methods is located on two levels, which are separated by the insulating layer 11. Above this layer are provided first structures and below this layer are provided second structures. Active devices may be provided within the substrate 13, such as diodes, cf. FIG. 2 in the transition region between the doped region 13' and 13" and the substrate 13, or FIG. 3 below the regions 13a in the transition area towards the substrate 13, or MOSFETs, bipolar transistors, thyristors or IGBTs, according to FIG. 1 only within the substrate 13.

The same devices may be located above for the insulating layer 11 within the active layer 12, or may at least extend into this layer according to FIG. 1.

Additionally, passive devices may be located within the substrate 13 as second structures, such as capacitors, resistors or a shielding layer, shown in FIG. 3a as 13a".

A resistor may be obtained, for instance, by a doped region, corresponding to the region 13a' in FIG. 3a, if it is contacted at its two ends by means of a metallic filling 20 in a respective via 19, in the sense of the ohmic contact 13b.

In FIG. 3b a continuous bridge 15" having two arms is shown, wherein the bridge 15" conductively connects the two residual layers 12" and 12"' and also simultaneously electrically conductively contacts the filling 20 in its center portion, wherein the filling is located in the via 19. It forms an ohmic contact and a conductive track (vertical plug) through the insulating layer and into the doped region 13a. At the opposite side, a metallic layer 14 is provided on the back side R.

The described contact assembly by means of the plugs 20 is provided for passive structures within the substrate 13. Shielding layers, such as the layer 13a" in FIG. 3a, do not require such a conductive connection to the front side. They may remain within the substrate in an insulated state. Such regions are then denoted as floating with respect to a potential (usually n.c.—not connected).

A shielding may be achieved by means of the substrate implantation 13a". This region acts as an electric shield.

FIG. 3c illustrates a metallic shield 14' above a filling 20 in a via 19 that connects to a doped region 13a, as is illustrated in FIG. 3. In addition to the shielding, which is typically considered as a metallization layer, a device 60 is schematically illustrated in a sectional view, which may correspond to that of FIG. 1, for instance, in the form of the device 40. At the left side of the device 60 in FIG. 3c, a trench is depicted, which is also clearly illustrated in FIG. 1 between two devices above the insulating layer 11.

The embodiment according to FIG. 3c has two opposing metallizations, extending from the front side V and the back side R, and also has semiconductor structures above the insulating layer 11 and within the substrate 13 below the insulating layer 11. The devices 60, 50 or 40 are dielectrically separated or insulated from each other by means of trenches extending down to the insulating layer 11. Therefore, the mutual electric interactions of such devices located on the same side are significantly reduced.

Such a dielectric insulation renders the SOI technology also suitable for high voltage applications. The devices are not coupled to each other via the substrate, and bulk contacts may be omitted for the benefit of body contacts for switchable devices.

Nevertheless, the substrate does not remain unconsidered, but, instead, is used for an extension of the described power circuits, that is, the substrate is provided with doped regions so as to provide the possibility for the integration of additional and different devices.

The back side metallization 14 in FIGS. 3b and 3c suppresses any adverse reactions on the circuit structures 40, 50 and 60 in and above the active silicon layer 12, i.e., the residuals after the patterning thereof in corresponding sections, which are referred to as 12', 12" and 12'".

We claim:

1. A method for manufacturing an integrated circuit on and in an SOI semiconductor wafer having a front and a back, wherein first structures having active devices in an upper semiconductor layer (12) and second structures (13a, 13a', 13c) of devices within the substrate (13) are connected by electric connection (20, 22) formed through an insulating layer (11), the method comprising the following steps:

performing an ion implantation (30, 31) with highly energetic ions in certain areas (13', 13") from the front through the upper semiconductor layer (12), through the insulating layer (11) and into the substrate (13);

performing a temperature treatment for activating the ions implanted into the substrate (13) in accordance with an implanted ion species, wherein the implanted ions are activated in a plurality of steps with different temperatures;

forming the first structures (30, 40, 50, 60) at least partially in the upper semiconductor layer as a single crystalline layer (12);

forming at least one of a plurality of vias in the insulating layer (11);

filling (20, 22) the at least one via (19, 21) in the insulating layer with a metallic material to provide a metallic filling;

forming-in the area of the first structures (40, 50, 60) insulated with respect to each other-metal conductors to electrically connect the first structures of the front with the second structure within the substrate (13) via the at least on metal filling in the at least one via.

2. The method of claim 1, wherein the insulating layer (11) is a silicon dioxide layer.

3. The method of claim 1, wherein a single insulating layer (11) is provided, through which the metal filling extends.

4. The method of claim 1, wherein the upper layer (12) is a thin layer with respect to the substrate (13) of the SOI wafer (10).

5. The method of claim 1, wherein the steps of the method are performed in the order as given in claim 1.

6. The method of claim 1, wherein devices below the insulating layer (11) are formed by using templates and different ion species (30, 31).

7. The method of claim 1, wherein a plurality of vias is filled with a plurality of metallic fillings.

8. The method of claim 1, wherein the vias are formed at locations at which no active single crystalline layer (12) is present, in the form of lateral insulation areas).

9. The method of claim 1, wherein the upper semiconductor layer (12) is comprised of silicon.

10. The method of claim 1, wherein the first structures (40) are at least partially formed in the upper silicon layer.

11. The method of claim 1, wherein the substrate (13) is comprised of a single crystalline silicon.

12. The method of claim 1, wherein simultaneously with the process of forming the at least one filling of the at least one via (19, 21), an ohmic contact (13B) or a conductive conductor to the substrate is formed.

13. The method of claim 1, wherein simultaneously with the process of forming the filling of the at least one via (19, 21), a Schottky contact (13C) is formed with the substrate (13).

14. The method of claim 1, wherein two first structures for two first devices (40, 50) above the insulating layer (11) are separated and insulated by at least one trench extending towards the insulating layer.

15. The method of claim 1, wherein a back side metallization (14) is formed on the back of the SOI semiconductor wafer.

16. The method of claim 1, wherein the metal conductors (15, 15') are metallization layers.

17. The method of claim 16, wherein the metal conductors are provided in the form of metal bridges on at least two non-identical levels above the insulating layer.

18. A method for forming an integrated circuit with a SOI semiconductor wafer, active device structures in a thin upper crystalline semiconductor layer being connected with device structures within substrate by means of electrical connections formed through the insulating layer, wherein a sequence of main method steps is performed in specified areas, performing an ion implantation with highly energetic ions from the front through the single crystalline semiconductor layer and the insulating layer into the substrate;

performing a temperature treatment for activating the implanted ions in several steps of different temperatures, adapted to the ion species implanted;

forming upper device structures in the single crystalline layer;

forming vias in the insulating layer at locations where no active thin single crystalline silicon layer is present;

filling the vias in the insulating layer with a metallic material;

forming metallization layers, insulated from each other within the area of the active device structures and electrically connecting the upper structures with those device structures within the substrate by means of the metal filling in said vias in the insulating layer.

19. The method of claim 18, wherein the insulating layer is a layer of silicon dioxide.

20. The method of claim 18, wherein independent bridges are provided to contact the metal fillings in said vias.

21. The method of claim 18, wherein a back side metallization (14) is provided on the substrate (13).

22. The method of claim 18, wherein the substrate is comprised of a single crystalline silicon wafer.

23. The method of claim 18, wherein along with the process of forming a metal bridge of one of the vias, an ohmic contact to the substrate is formed.

24. The method of claim 18, wherein along with the process of forming a respective metal bridge of a respective via, a Schottky contact with the substrate is formed.

25. A method for forming an integrated circuit with a SOI semiconductor wafer, active device structures in a thin upper crystalline semiconductor layer being connected with device structures within substrate by means of electrical connections formed through the insulating layer, wherein a sequence of main method steps is performed in specified areas, performing an ion implantation with highly energetic ions from the front through the single crystalline semiconductor layer and the insulating layer into the substrate;

performing a temperature treatment for activating the implanted ions;

forming upper device structures in the single crystalline layer;

forming vias in the insulating layer at locations where no active thin single crystalline silicon layer is present;

filling the vias in the insulating layer with a metallic material;

forming metallization layers, insulated from each other, within the area of the active device structures and electrically connecting the upper structures with those device structures within the substrate by means of the metal filling in said vias in the insulating layer; and the metallization layers having metal conductors (15, 15'), the metal conductors being provided in the form of metal bridges on at least two non-identical levels above the insulating layer.

* * * * *

UNITED STATES PATENT AND TRADEMARK OFFICE
CERTIFICATE OF CORRECTION

PATENT NO. : 7,195,961 B2  Page 1 of 1
APPLICATION NO. : 10/543923
DATED : March 27, 2007
INVENTOR(S) : Richter et al.

It is certified that error appears in the above-identified patent and that said Letters Patent is hereby corrected as shown below:

In column 1, line 14, in the heading after "BACKGROUND", please insert -- AND --

In column 2, line 10, delete [on] and insert -- one --

In column 3, line 12, delete [SQI] and insert -- SOI --

In column 3, line 36, delete [of] and insert -- cf. --

In column 7, line 38, delete [on] and insert -- one --.

Signed and Sealed this

Twenty-ninth Day of July, 2008

JON W. DUDAS
*Director of the United States Patent and Trademark Office*